(12) United States Patent
Li

(10) Patent No.: US 10,261,113 B2
(45) Date of Patent: Apr. 16, 2019

(54) POWER CONVERTER WITH AVERAGE CURRENT DETECTION AND THE DETECTING CIRCUIT AND METHOD THEREOF

(71) Applicant: Chengdu Monolithic Power Systems Co., Ltd., Chengdu (CN)

(72) Inventor: Yike Li, Chengdu (CN)

(73) Assignee: Chengdu Monolithic Power Systems Co., Ltd., Chengdu (CN)

(*) Notice: Subject to any disclaimer, the term of this patent is extended or adjusted under 35 U.S.C. 154(b) by 427 days.

(21) Appl. No.: 14/788,361

(22) Filed: Jun. 30, 2015

(65) Prior Publication Data

US 2015/0381051 A1 Dec. 31, 2015

(30) Foreign Application Priority Data

Jun. 30, 2014 (CN) .......................... 2014 1 0304598

(51) Int. Cl.
*H02M 3/156* (2006.01)
*G01R 19/00* (2006.01)
*H02M 3/158* (2006.01)
*H02M 1/00* (2006.01)

(52) U.S. Cl.
CPC .......... *G01R 19/003* (2013.01); *H02M 3/156* (2013.01); *H02M 3/1588* (2013.01); *H02M 2001/0009* (2013.01); *Y02B 70/1466* (2013.01)

(58) Field of Classification Search
CPC . H02M 2001/0003; H02M 2001/0009; H02M 2003/075; H02M 3/156; H02M 3/1563; H02M 3/158; H02M 3/18; H02M 3/07; H02M 3/073
See application file for complete search history.

(56) References Cited

U.S. PATENT DOCUMENTS

| | | | |
|---|---|---|---|
| 6,370,050 B1* | 4/2002 | Peng ................. | H02M 3/33576 363/17 |
| 7,498,784 B2* | 3/2009 | Gokita ................. | G01R 19/003 323/282 |
| 8,576,588 B2 | 11/2013 | Kuang et al. | |
| 8,854,021 B2* | 10/2014 | Saito ................... | H02M 3/1584 323/272 |
| 9,041,459 B2* | 5/2015 | Szczeszynski ........... | G05F 3/02 327/536 |

(Continued)

*Primary Examiner* — Timothy J. Dole
*Assistant Examiner* — Shahzeb K Ahmad
(74) *Attorney, Agent, or Firm* — Perkins Coie LLP

(57) ABSTRACT

A power converter with average current detection and the corresponding detecting method and detecting circuit are disclosed. The average current detecting circuit has an average voltage detecting circuit and a voltage-current converting circuit. The average voltage detecting circuit generates a voltage across a detecting resistor by letting an inductor current flowing through an output inductor of the power converter flowing through the detecting resistor. Further, the average voltage detecting circuit samples the voltage across the detecting resistor when a switch of the power converter transits from an on state into an off state and the opposite and then calculates the average value of the two sampled voltages. The voltage-current converting circuit converts the average value into an average current by multiplying the average value by a scaling factor.

20 Claims, 12 Drawing Sheets

(56) References Cited

U.S. PATENT DOCUMENTS

| | | | | |
|---|---|---|---|---|
| 2006/0261860 | A1* | 11/2006 | Yamada | H02M 3/156 |
| | | | | 327/77 |
| 2013/0082689 | A1 | 4/2013 | Xu et al. | |
| 2014/0300333 | A1* | 10/2014 | Chen | G01R 19/25 |
| | | | | 323/282 |
| 2015/0084701 | A1* | 3/2015 | Perreault | H03F 3/193 |
| | | | | 330/297 |
| 2015/0295494 | A1* | 10/2015 | Gong | H05B 33/0815 |
| | | | | 315/224 |
| 2016/0056714 | A1* | 2/2016 | Ek | H02M 3/07 |
| | | | | 323/271 |

* cited by examiner

POWER CONVERTER WITH AVERAGE CURRENT DETECTION AND THE DETECTING CIRCUIT AND METHOD THEREOF

CROSS-REFERENCE TO RELATED APPLICATION(S)

This application claims the benefit of CN application No. 201410304598.3, filed on Jun. 30, 2015, and incorporated herein by reference.

TECHNICAL FIELD

The present invention relates generally to electronic circuits, and more particularly but not exclusively to an average current detecting circuit and method thereof.

BACKGROUND

There is often a desire to get the information of a DC output current of a power converter. Just by way of example, the DC output current information may be needed to make a judgment of the load state of the power converter. One way to obtain the DC output current information is to detect the average value of an inductor current flowing through an output inductor of the power converter. However, the prior art average current detecting circuits are either complicated or in need of a high-speed circuit (e.g., an amplifier with a high bandwidth) which causes considerable power consumption.

Thus, an average current detecting circuit with simple configuration and low power consumption is desired to address these and/or other issues associated with the prior arts.

SUMMARY

Embodiments of the present invention are directed to an average current detecting circuit for a power converter. The power converter has a control circuit and a switching circuit. The switching circuit has a switch and an output inductor. The average current detecting circuit has an average voltage detecting circuit and a voltage-current converting circuit. The average voltage detecting circuit has a detecting resistor having a first terminal and a second terminal. The average voltage detecting circuit is configured to receive an inductor current flowing through the output inductor. The average voltage detecting circuit is configured to sample the values of the voltage across the detecting resistor created by the inductor current at the moments when the switch is turned on and off and to calculate the average value of the sampled voltage values. The voltage-current converting circuit is electrically coupled to the average voltage detecting circuit to receive the average value. The voltage-current converting circuit is configured to generate an average current proportional to the average value with a scaling factor.

Embodiments of the present invention are also directed to a power converter having a switching circuit, a control circuit and an average current detecting circuit. The switching circuit has a switch and an output inductor. The switching circuit is configured to receive an input voltage and to further convert the input voltage into an output voltage. The control circuit is configured to generate a control signal to control the switching actions of the switch. The average current detecting circuit has an average voltage detecting circuit and a voltage-current converting circuit. The average voltage detecting circuit has a detecting resistor having a first terminal and a second terminal. The detecting resistor is configured to receive an inductor current flowing through the output inductor. The average voltage detecting circuit is configured to sample the values of the voltage across the detecting resistor created by the inductor current at moments when the switch is turned on and off and to calculate the average value of the sampled voltage values. The voltage-current converting circuit is electrically coupled to the average voltage detecting circuit to receive the average value. The voltage-current converting circuit is configured to generate an average current proportional to the average value with a scaling factor.

Embodiments of the present invention are further directed to a method for detecting an average current of a power converter. The power converter has a switch and an output inductor. The detecting method comprises: generating a voltage across a detecting resistor created by an inductor current flowing through the output inductor; sampling the values of the voltage at moments when the switch is respectively turned on and off; calculating the average value of the sampled voltage values to generate an average voltage; and generating an average current proportional to the average voltage with a scaling factor.

BRIEF DESCRIPTION OF THE DRAWINGS

The present invention can be further understood with reference to the following detailed description and the appended drawings, wherein like elements are provided with like reference numerals.

DETAILED DESCRIPTION

Figure 1:
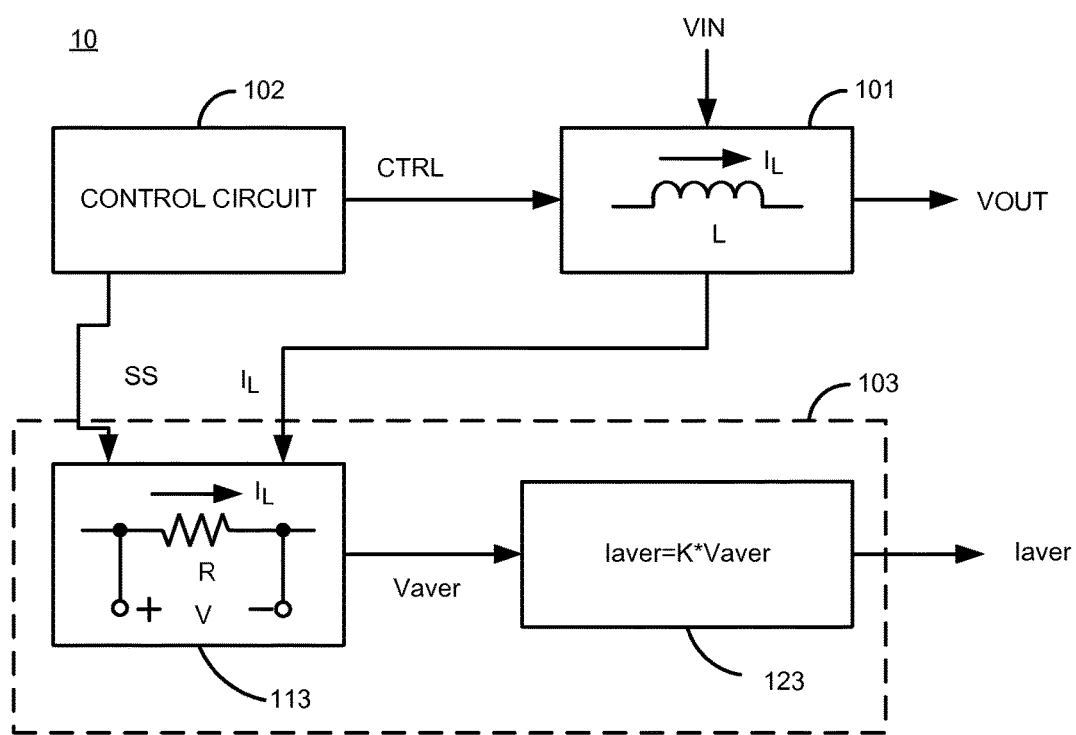
FIG. 1 illustrates a power converter 10 in accordance with an embodiment of the present invention.

The present invention is now described. While it is disclosed in its preferred form, the specific embodiments of the invention as disclosed herein and illustrated in the drawings are not to be considered in a limiting sense. Rather, these embodiments are provided so that this invention will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment or an embodiment combining software and hardware aspects. The following detailed description is, therefore, not to be taken in a limiting sense.

Throughout the specification, the meaning of "a," "an," and "the" may also include plural references. Just by way of example, "a switch" or "the switch" of the switching circuit may sometimes comprise both "a high-side switch" and "a low-side switch" in a synchronous switching topology as will be illustrated later, or just "the high-side switch" in an asynchronous switching topology on the other hand. For another example, "a logic signal" or "the logic signal" from the control circuit may refer to two signals respectively provided to control "the high-side switch" and "the low-side switch" in the synchronous switching topology. But, of course, "a logic signal" or "the logic signal" from the control circuit may refer to a single signal provided to control "the high-side switch" in the asynchronous switching topology.

In addition, persons of ordinary skill in the art will recognize that, the term "turned on" throughout the entire description may refer to the moment when a switch transits from an off state into an on state, but may also refer to a time period during which a switch is in an on state, depending on the specific situation. Similarly, the term "turned off" may be construed in a similar way.

FIG. 1 illustrates a power converter 10 in accordance with an embodiment of the present invention. As shown in FIG. 1, the power converter 10 comprises a switching circuit 101, a control circuit 102 and an average current detecting circuit 103.

The switching circuit 101 comprises a switch (not shown) and an output inductor L. The switching circuit 101 is configured to receive an input voltage VIN and to further convert the input voltage VIN into an output voltage VOUT by controlling the switching actions of the switch. It should be noted that the switching circuit 101 may take any appropriate switching mode converting topology where there is a desire for outputting the average current information, such as a synchronous or asynchronous buck converter or a forward converter etc. Further, the switch of the switching circuit 101 may be accomplished with any controllable semiconductor switching device, for example, a Metal-Oxide-Semiconductor Field Effect transistor (MOSFET), an Insulated-Gate-Bipolar transistor (IGBT) or the like. Still yet, the switch of the switching circuit 101, in one embodiment, may be a component of the control circuit 102 while the output inductor L is externally provided by the user.

The control circuit 102 is configured to generate a switching signal SS, as well as a logic signal CTRL to control the switching actions of the switch of the switching circuit 101. In one embodiment, the control circuit 102 may be accomplished with Pulse-Width-Modulation (PWM) or Pulse-Frequency-Modulation (PFM), such as Constant-On-Time control or Constant-Off-Time control and so on.

The average current detecting circuit 103 comprises an average voltage detecting circuit 113 and a voltage-current converting circuit 123. The average voltage detecting circuit 113 comprises a detecting resistor R having a first terminal and a second terminal, wherein the first terminal is electrically coupled to the switching circuit 101 to receive an inductor current $I_L$ flowing through the output inductor L which in turn creates a voltage across the detecting resistor R. The voltage across the detecting resistor R created by the inductor current $I_L$ is defined as a detecting voltage V. It should be noted that, in the context of the present invention, the inductor current $I_L$ flowing through the output inductor L may refer to the current flowing through the switch of the switching circuit. Especially, in one embodiment where a high-side switch and a low-side switch are comprised in the switching circuit, as will be illustrated later, the inductor current $I_L$ may refer to the current flowing through the high-side switch or the low-side switch. But, of course, other embodiments are contemplated where the inductor current may refer to the sum of the current flowing through the high-side switch and the current flowing through the low-side switch. Further, in another embodiment, the detecting resistor R may refer to the on-resistor of the switch, a resistor electrically coupled to the switch in series, or any resistor comprised in a conducting loop in which the inductor current $I_L$ flows.

In addition, the average voltage detecting circuit 113 is further electrically coupled to the control circuit 102 to receive the switching signal SS and is thus configured to sample the values of the detecting voltage V at the moments when the switch transits from an on state into an off state or the opposite, under the control of the switching signal SS. The average voltage detecting circuit 113 is further configured to calculate the average value of the sampled voltage values at the two aforementioned transition moments, wherein the average value serves as an average voltage Vaver output by the average voltage detecting circuit 113. Persons of ordinary skill in the art will recognize that, in one embodiment where the switch of the switching circuit comprises a high-side switch and a low-side switch, and the foregoing transition moments may accordingly refer to the moments when the high-side switch is turned on and off or the moments when the low-side switch is turned on and off. In another embodiment, if the sampled detecting voltage at the transition moment is negative relative to a defined direction, the average voltage detecting circuit further operates to convert the negative voltage into a positive one prior to the calculation of the average value.

With continuing reference to FIG. 1, the voltage-current converting circuit 123 is electrically coupled to the average voltage detecting circuit 113 to receive the average voltage Vaver and is further configured to generate an average current layer by multiplying the average voltage Vaver by a scaling factor K proportional to 1/R (R refers to the resistance of the detecting resistor herein). In one embodiment, the scaling factor K is equal to 1/R, thus the average current layer is the real DC output current of the power converter 10.

As shown, the real-time voltage across the detecting resistor R is proportional to the real-time current flowing therethrough (i.e., the inductor current $I_L$) with a scaling factor equal to the resistance of the detecting resistor R, thus making the average voltage Vaver proportional to the average value of the inductor current $I_L$. On the other hand, as the average current layer is proportional to the average voltage Vaver with the scaling factor proportional to 1/R, the average current layer represents the DC output current of the power converter 10 regardless of the variation of the resistance of the detecting resistor R. That is, the average current layer comprises the information of the DC output current of the power converter.

Figure 2:
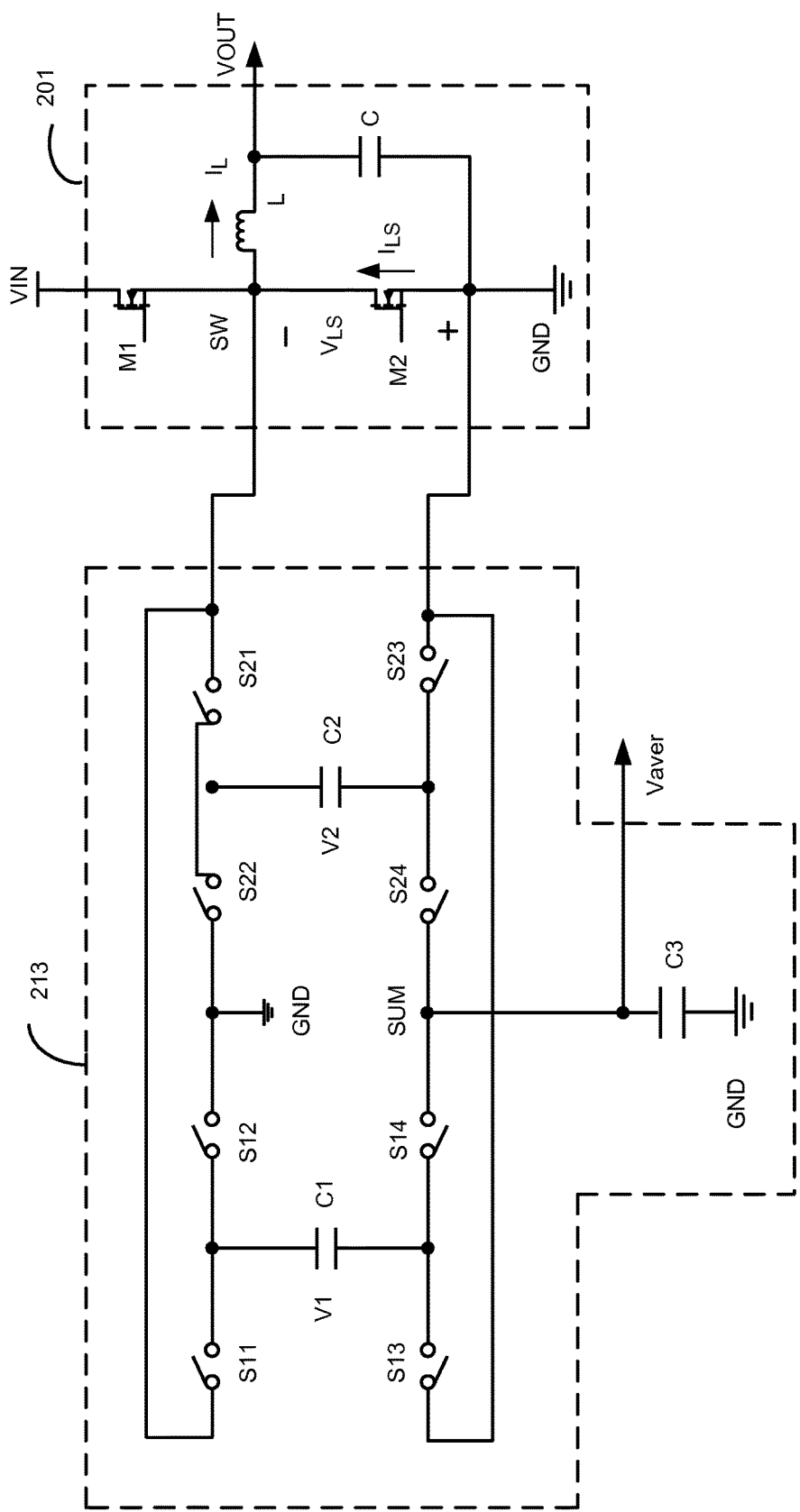
FIG. 2 illustrates an average voltage detecting circuit 213 in accordance with an embodiment of the present invention.

FIG. 2 illustrates an average voltage detecting circuit 213 in accordance with an embodiment of the present invention. As shown in FIG. 2, the average voltage detecting circuit 213 is electrically coupled to a switching circuit 201. As an option, the switching circuit 201 is accomplished with a buck converting topology, as illustrated in FIG. 2. The switching circuit 201 comprises a high-side switch M1, a low-side switch M2, an output inductor L and an output capacitor C. The high-side switch M1 has a first terminal, a second terminal and a control terminal, wherein the first terminal is configured to receive an input voltage VIN. The low-side switch M2 has a first terminal, a second terminal and a control terminal, wherein the first terminal is electrically coupled to the second terminal of the high-side switch M1, thus forming a switching node SW, and the second terminal is electrically coupled to a reference ground GND. A current $I_{LS}$ flowing through the low-side switch M2 is defined with a direction directing from the second terminal to the first terminal when the low-side switch M2 is turned on, as illustrated by the arrow presented in FIG. 2. Such current $I_{LS}$ creates a voltage $V_{LS}$ across the on-resistor of the low-side switch M2, with a positive polarity (+) at the second terminal of the low-side switch M2 as well as a negative polarity (−) at the first terminal of the low-side switch M2, as marked in FIG. 2. The output inductor L has a first terminal and a second terminal, wherein the first terminal is electrically coupled to the switching node SW. An inductor current $I_L$ flows through the output inductor L from the first terminal to the second terminal, with a defined direction shown by the arrow as illustrated in FIG. 2. Upon the definitions of the inductor current $I_L$ and the current $I_{LS}$ as set forth above, the inductor current $I_L$ flowing through the output inductor L refers to the current $I_{LS}$ flowing through the low-side switch M2 when the low-side switch M2 is on and the high-side switch M1 is off, in the embodiment of FIG. 2. The output capacitor C is electrically coupled between the second terminal of the output inductor L and the reference ground GND, wherein the voltage across the output capacitor C serves as an output voltage VOUT of the switching circuit 201. Persons of ordinary skill in the art will recognize that the switching circuit 201 of FIG. 2 is for illustrative purpose and should not be construed as limiting the scope of the present invention in any manner, in another embodiment, the switching circuit may be contemplated with any other appropriate form of switching topology, such as a forward converter.

The average voltage detecting circuit 213 comprises switches S11~S14 and S21~S24 and capacitors C1~C3. The switch S11 has a first terminal and a second terminal, wherein the first terminal is electrically coupled the switching node SW. The switch S12 has a first terminal and a second terminal, wherein the first terminal is electrically coupled to the second terminal of the switch S11, and the second terminal is electrically coupled to the reference ground GND. The switch S13 has a first terminal and a second terminal, wherein the first terminal is electrically coupled to the reference ground GND. The switch S14 has a first terminal and a second terminal, wherein the first terminal is electrically coupled to the second terminal of the switch S13. The capacitor C1 has a first terminal and a second terminal, wherein the first terminal is electrically coupled to the second terminal of the switch S11, and the second terminal is electrically coupled to the second terminal of the switch S13. The switch S21 has a first terminal and a second terminal, wherein the first terminal is electrically coupled to the switching node SW. The switch S22 has a first terminal and a second terminal, wherein the first terminal is electrically coupled to the second terminal of the switch S21, and the second terminal is electrically coupled to the reference ground GND. The switch S23 has a first terminal and a second terminal, wherein the first terminal is electrically coupled to the reference ground GND. The switch S24 has a first terminal and a second terminal, wherein the first terminal is electrically coupled to the second terminal of the switch S23, and the second terminal is electrically coupled to the second terminal of the switch S14, thus forming an output terminal SUM of the average voltage detecting circuit 213. The capacitor C2 has a first terminal and a second terminal, wherein the first terminal is electrically coupled to the second terminal of the switch S21, and the second terminal is electrically coupled to the second terminal of the switch S23, and wherein the capacitance of the capacitor C2 is equal to that of the capacitor C1. The capacitor C3 is electrically coupled between the output terminal SUM of the average voltage detecting circuit 213 and the reference ground GND. The voltage at the output terminal SUM of the average voltage detecting circuit serves as the average voltage Vaver of the average voltage detecting circuit 213.

It should be noted that it is shown in FIG. 2 that the first terminals of the switches S11 and S21 are electrically coupled to the switching node SW and the first terminals of the switches S13 and S23 are electrically coupled to the reference ground GND to detect the voltage across the on-resistor of the low-side switch M2. But, of course, in another embodiment, the on-resistor of the low-side switch M2 may be replaced with any other appropriate detecting resistor having a first terminal and a second terminal, wherein the inductor current $I_L$ flows from the first terminal to the second terminal. In such embodiment, the first terminals of the switches S11 and S21 are electrically coupled to the second terminal of the detecting resistor, and the first terminals of the switches S13 and S23 are electrically coupled to the first terminal of the detecting resistor.

Figure 3:
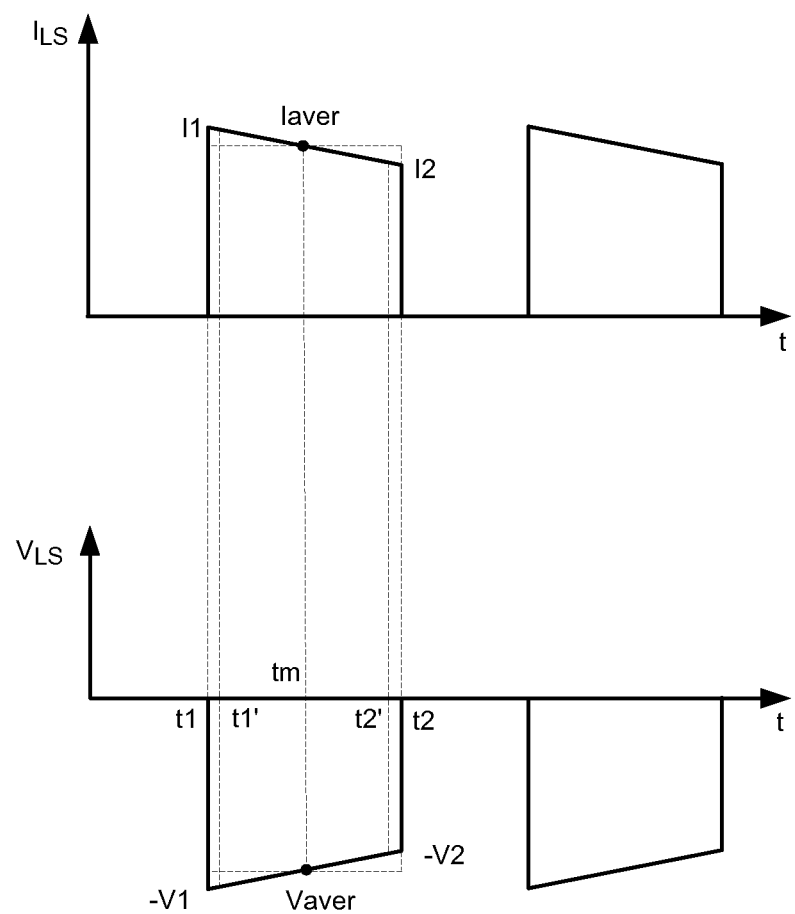
FIG. 3 graphically illustrates the current ILS as well as the voltage VLS over time with reference to FIG. 2.

FIG. 3 graphically illustrates the current $I_{LS}$ as well as the voltage $V_{LS}$ over time with reference to FIG. 2. In FIG. 3, t1 and t2 respectively represent the moments when the low-side switch M2 is turned on and off, while tm represents the moment at the midpoint of the on time period of the low-side switch M2. In addition, t1' represents a moment right after moment t1, and t2' represents a moment right before moment t2. Further, V1 and V2 respectively represent the absolute values of the voltage across the low-side switch M2 at moment t1 and moment t2. And I1 and I2 respectively represent the values of the current flowing through the low-side switch M2 at moment t1 and moment t2.

More illustrative information will now be set forth regarding to the operation of the average voltage detecting circuit 213, with reference to FIG. 4(a)~FIG. 4(e).

Figure 4A:
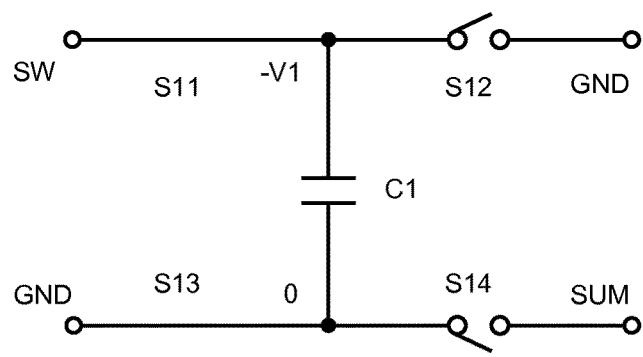
FIG. 4(a)–4(e) illustrate the operation of the average voltage detecting circuit 213 of FIG. 2.

As shown in FIG. 4(a), at moment t1, the switches S11 and S13 are turned on, while the switches S12 and S14 are turned off. In addition, as set forth above, the high-side switch M1 is turned on and the low-side switch M2 is turned off at moment t1, thus allowing the inductor current $I_L$ (i.e., the current $I_{LS}$) flowing through the low-side switch M2 with the direction as shown by the arrows of FIG. 2. By this design, the capacitor C1 samples the voltage $V_{LS}$ across the low-side switch M2. Further, upon the definitions of the voltage $V_{LS}$, the inductor current $I_L$ and the current $I_{LS}$, the potential at the first and second terminals of the capacitor C1 are respectively −V1 and zero volts.

Figure 4B:
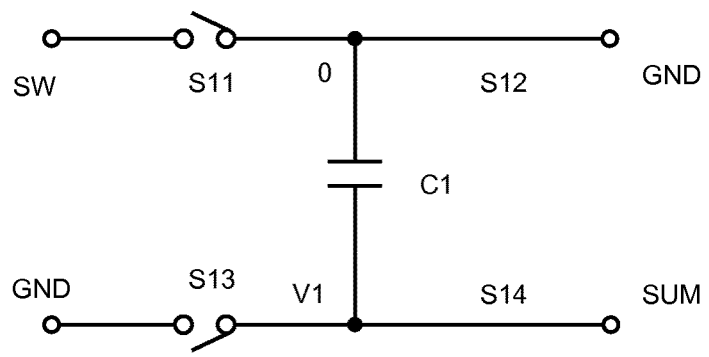

As shown in FIG. 4(b), at moment t1', the switches S11 and S13 are turned off, while the switch S12 is turned on. It should be noted that, the switch S14 is shown to be in an on state in FIG. 4(b), however, in another embodiment, the switch S14 may be in an on or off state, per the desire of design. As the first terminal of the capacitor C1 is grounded at moment t1', the potential at the first terminal converts from −V1 volts to zero volts. Upon the intrinsic characteristic of the capacitor, the voltage across the capacitor C1 at moment t1' remains the same as that at moment t1, thus making the potential at the second terminal of the capacitor C1 converting from zero volts to V1 volts.

Figure 4C:
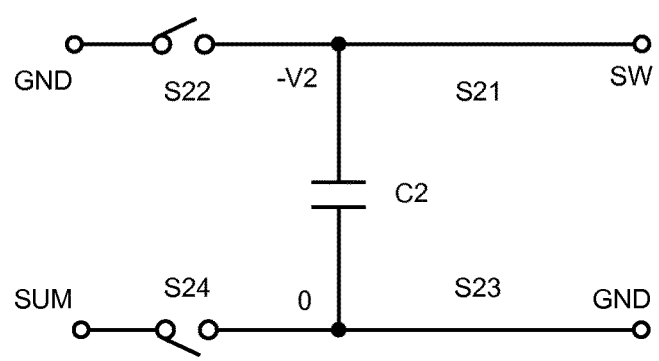

As shown in FIG. 4(c), at moment t2', the switches S21 and S23 are turned on, while the switches S22 and S24 are turned off. Similar to the operation of the circuit shown in FIG. 4(a), the capacitor C2 samples the voltage $V_{LS}$ across the low-side switch M2, with the potentials at the first and second terminals of the capacitor C2 respectively—V2 and zero volts.

Figure 4D:
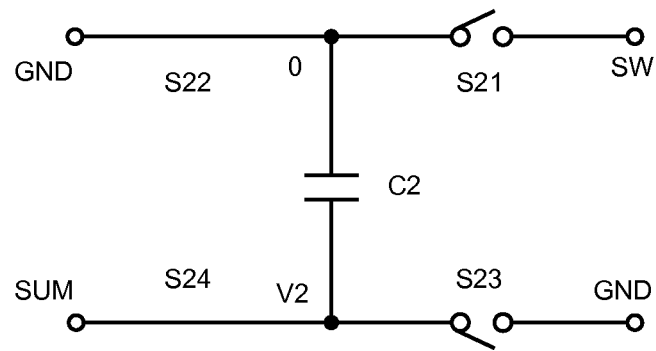

As shown in FIG. 4(d), at moment t2, the switches S21 and S23 are turned off, while the switch S22 is turned on. Still yet, the switch S24 is shown to be in an on state in FIG. 4(d), however, in another embodiment, the switch S24 may be in an on or off state, per the desire of design. Again, upon the intrinsic characteristic of the capacitor C2 and the first terminal being grounded, the potential at the first terminal of the capacitor C2 converts from −V2 volts to 0 volts, and the potential at the second terminal thereof converts from 0 volts to V2 volts.

Figure 4E:
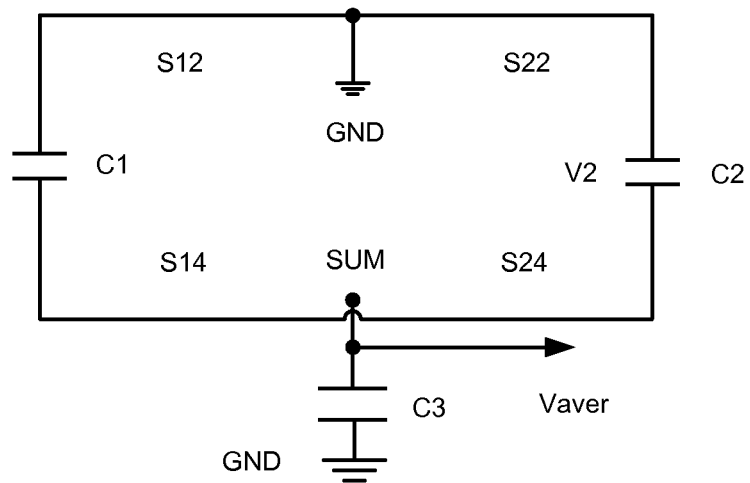

At moment t2 or any moment between moment t2 of the present cycle and moment t1 of the next cycle, the switches S12, S14, S22 and S24 are turned on, as illustrated in FIG. 4(e). As mentioned earlier, the capacitance of the capacitor C1 is equal to that of the capacitor C2. The voltage across the capacitor C3 is thus equal to the average value of the absolute voltage values V1 and V2. That is, the average voltage Vaver is provided at the output terminal SUM of the average voltage detecting circuit 213, with a value of (V1+V2)/2. After several switching cycles, the average voltage Vaver (the voltage across the capacitor C3) is substantially equal to the voltage across the low-side switch M2 at moment tm.

Persons of ordinary skill in the art will recognize that, FIG. 4(a)~FIG. 4(e) partially show the average voltage detecting circuit 213 of FIG. 2 and the corresponding states of the shown switches for clarity purpose. The not-shown portion of the average voltage detecting circuit 213 may be any combination of the switching states without deviating the spirit of the present invention.

Figure 5:
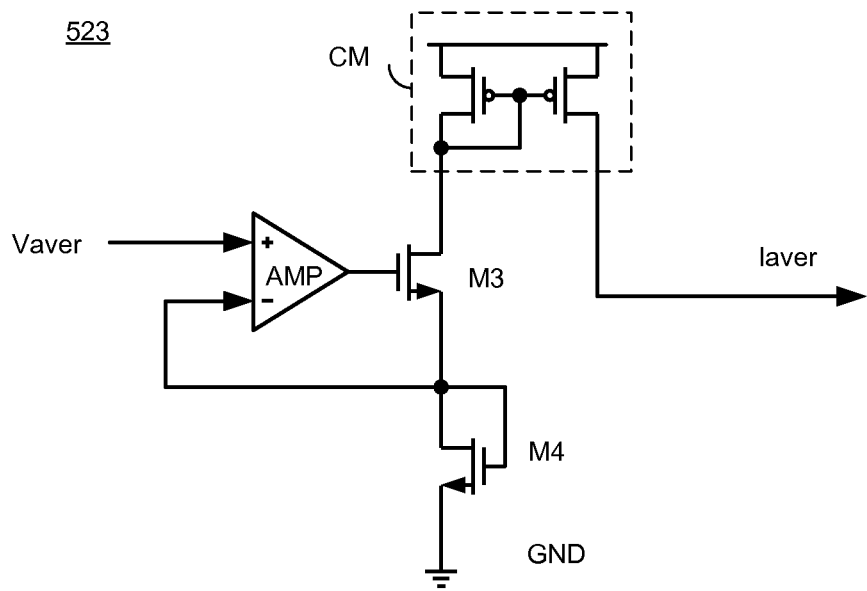
FIG. 5 illustrates a voltage-current converting circuit 523 in accordance with an embodiment of the present invention.

FIG. 5 illustrates a voltage-current converting circuit 523 in accordance with an embodiment of the present invention. The voltage-current converting circuit 523 comprises an error amplifier AMP, transistors M3 and M4, and a current mirror CM. The error amplifier AMP has a non-inverting input terminal (+), an inverting input terminal (−) and an output terminal, wherein the non-inverting input terminal (+) is electrically coupled to the average voltage detecting circuit 113 to receive the average voltage Vaver. The transistor M3 has a first terminal, a second terminal and a control terminal, wherein the control terminal is electrically coupled to the output terminal of the error amplifier AMP. The transistor M4 has a first terminal, a second terminal and a control terminal, wherein the first terminal is electrically coupled to the second terminal of the transistor M3, the inverting input terminal (−) of the error amplifier AMP, as well as the control terminal of the transistor M4 itself, and the second terminal is electrically coupled to a reference ground GND. The on-resistance of the transistor M4 is proportional to the resistance of the detecting resistor R of the average voltage detecting circuit 113 with a scaling factor K1, making the current flowing through the transistor M4 equal to Vaver/(K1×R). The current mirror has a first terminal and a second terminal, wherein the first terminal is electrically coupled to the first terminal of the transistor M3 to receive the current flowing through the transistor M4, and the second terminal is configured to output an average current Iaver. In accordance with the operating principle of current mirrors, the average current Iayer at the second terminal of the current mirror CM is equal to the current received at the first terminal, i.e., Iaver=Vaver/(K1×R). Especially, in one embodiment where the on-resistance of the transistor M4 is equal to the resistance of the detecting resistor R, there is Iaver=Vaver/R. Thus, the average current Iayer is equal to the real DC output current of the switching circuit.

Figure 6:
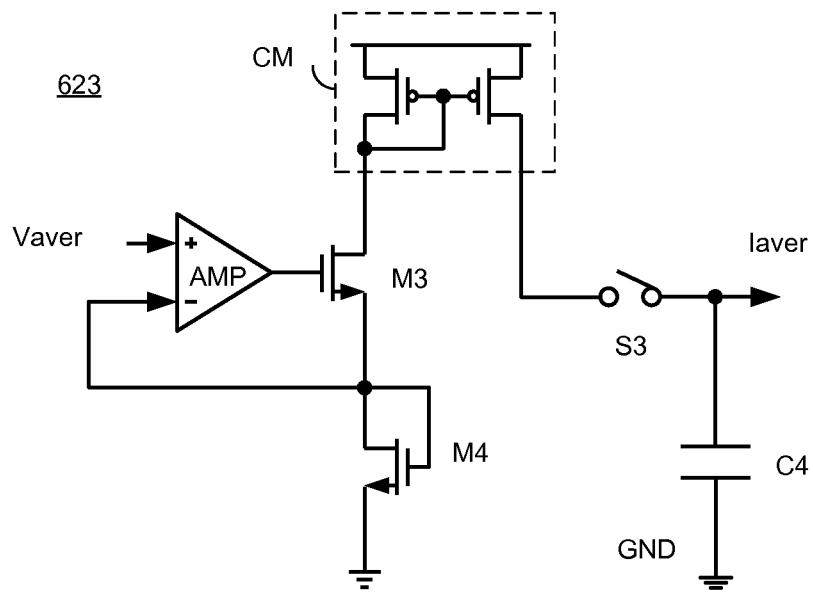
FIG. 6 illustrates a voltage-current converting circuit 623 in accordance with another embodiment of the present invention.

FIG. 6 illustrates a voltage-current converting circuit 623 in accordance with another embodiment of the present invention. The configuration of the voltage-current converting circuit 623 is similar to that of the voltage-current converting circuit 523 of FIG. 5 and will thus not be described herein for clarity purpose. Compared with the voltage-current converting circuit 523 of FIG. 5, the voltage-current converting circuit of FIG. 6 further comprises a switch S3 and a capacitor C4. The switch S3 has a first terminal, a second terminal and a control terminal, wherein the first terminal is electrically coupled to the second terminal of the current mirror CM, the control terminal is configured to receive the logic signal of the control circuit 102 to turn off the switch S3 when the switches of the switching circuit 101 are all off, and the second terminal is configured to output the average current Iaver. The capacitor C4 is electrically coupled between the second terminal of the switch S3 and the reference ground GND. The voltage-current converting circuit 623 of FIG. 6 provides an average current with high accuracy, even when the power converter operates in Discontinuous-Current-Mode (DCM).

Figure 7:
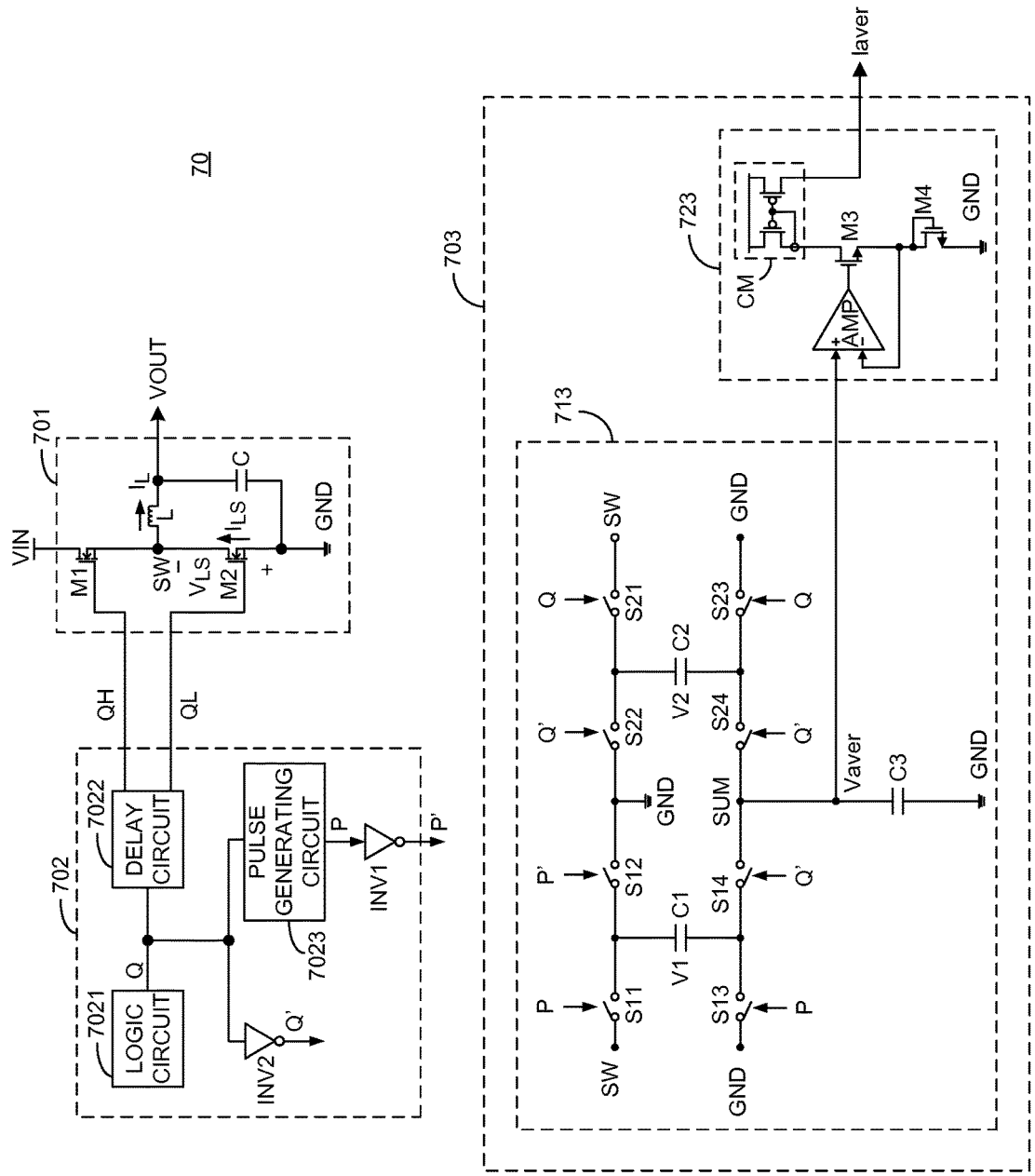
FIG. 7 illustrates a power converter 70 in accordance with an embodiment of the present invention.

FIG. 7 illustrates a power converter 70 in accordance with an embodiment of the present invention. As shown in FIG. 7, the power converter 70 comprises a switching circuit 701, a control circuit 702 and an average current detecting circuit 703. The switching circuit 701 has a same configuration as that of the switching circuit 201 and will not be described herein for clarity purpose.

Figure 8:
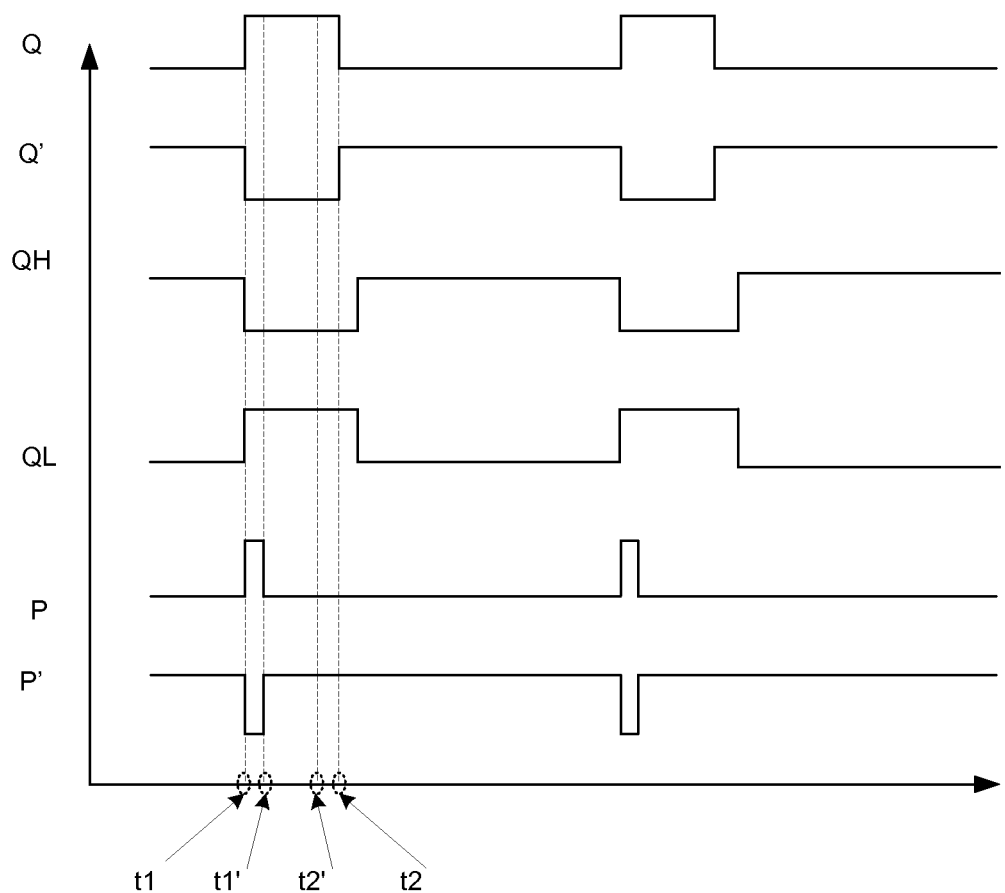
FIG. 8 illustrates the waveforms of the signals of the control circuit 702.

The control circuit 702 comprises a logic circuit 7021, a delay circuit 7022, a pulse generating circuit 7023 and inverters INV1 and INV2. The logic circuit 7021 is configured to generate a logic signal Q. The delay circuit 7022 is electrically coupled to the logic circuit 7021 to receive the logic signal Q and is further configured to delay the falling edge of the logic signal Q and to thus provide control signals QH and QL respectively to the control terminals of the high-side switch M1 and the low-side switch M2 so that the switching circuit 701 converts an input voltage VIN into an output voltage VOUT by controlling the switching actions of the high-side switch M1 and the low-side switch M2. The pulse generating circuit 7023 is electrically coupled to the logic circuit 7021 to receive the logic signal Q and is thus configured to generate a pulse signal P at the rising edge of the logic signal Q. The inverter INV1 is electrically coupled to the pulse generating circuit 7023 to receive the pulse signal P, thus providing an inverted pulse signal P'. The inverter INV2 is electrically coupled to the logic circuit 7021 to receive the logic signal Q and to generate an inverted logic signal Q'. It should be noted that the control circuit 702 is for illustrative purpose and should not be construed as limiting the scope of the present invention in any manner, other embodiments may be contemplated with other appropriate topologies. FIG. 8 illustrates the waveforms of the signals of the control circuit 702. As illustrated in FIG. 8, the waveforms from top down respectively show the logic signal Q, the inverted logic signal Q', the control signals QH and QL, the pulse signal P and the inverted pulse signal P'.

The average current detecting circuit 703 comprises an average voltage detecting circuit 713 and a voltage-current converting circuit 723. The voltage-current converting circuit 723 is accomplished with the voltage-current converting circuit 523 as illustrated in FIG. 5 and will not be described herein for clarity purpose. However, it should be noted that any other appropriate form of voltage-current converting circuit configured to generate an average current proportional to the average voltage with a scaling factor may be employed in the average current detecting circuit 703 without deviating the spirit of the present invention.

The average voltage detecting circuit 713 has a similar configuration as that of the average voltage detecting circuit 213 as illustrated in FIG. 2 and the same part will not be described herein for clarity purpose. Compared with the average voltage detecting circuit 213 of FIG. 2, in the average voltage detecting circuit 713, the control terminals of the switches S11 and S13 are configured to receive the pulse signal P, the control terminal of the switch S12 is configured to receive the inverted pulse signal P', the control terminals of the switches S14, S22 and S24 are configured to receive the inverted logic signal Q', while the control terminals of the switches S21 and S23 are configured to receive the logic signal Q.

More information will now be set forth regarding to the operation of the average voltage detecting circuit 713, with reference to FIG. 8 and FIG. 9(a)–FIG. 9(c). For convenience of description, MOD1, MOD2 and MOD3 are respectively employed to denote the states of the interconnection of the components within the average voltage detecting circuit 713 at moments t1, t1'/t2' and t2.

Figure 9A:
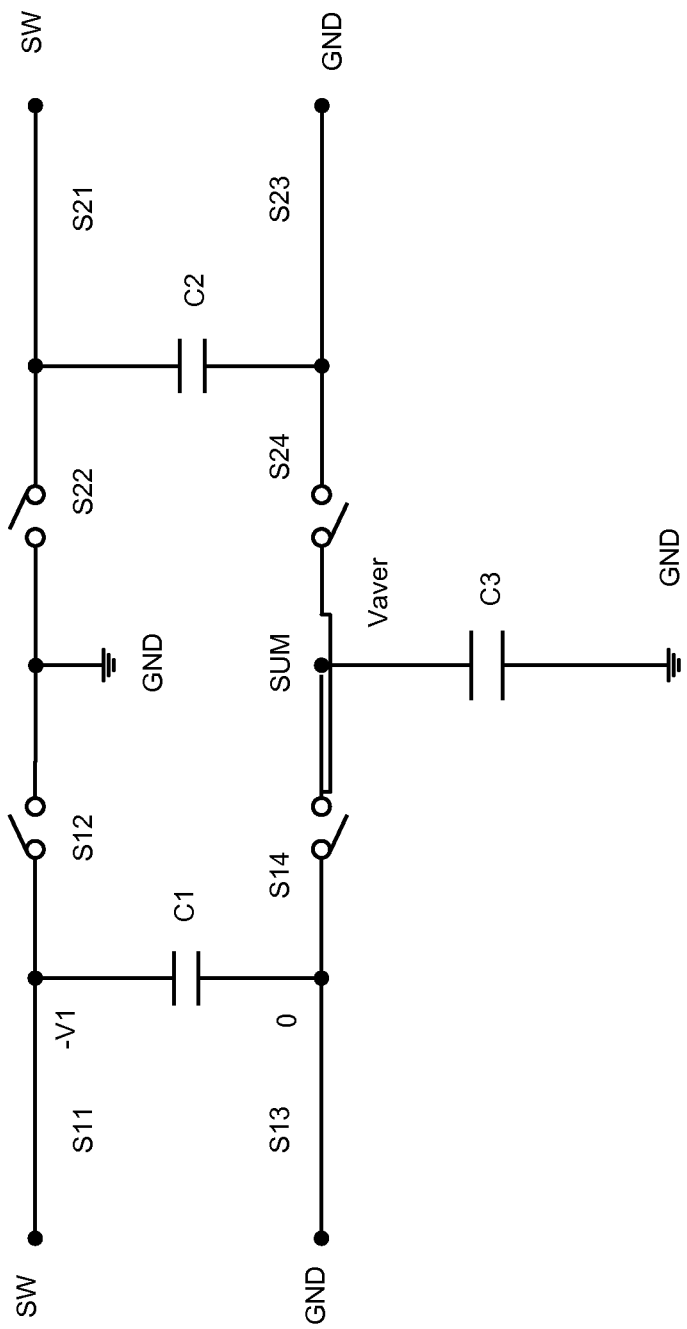
FIG. 9(a)–9(c) illustrate the operation of the average voltage detecting circuit 713 of FIG. 7.

As shown in FIG. 9(a), in mode MOD1, the logic signal Q and pulse signal P are both logic high, while the inverted logic signal Q' and the inverted pulse signal P' are both logic low, thus turning on the switches S11, S13, S21 and S23 as well as turning off the switches S12, S14, S22 and S24. As a result, the capacitor C1 is electrically coupled to the low-side switch M2 in parallel and thus samples the voltage across the low-side switch M2. Thus, the potentials at the first and second terminals of the capacitor C1 are respectively −V1 volts and zero volts.

Figure 9B:
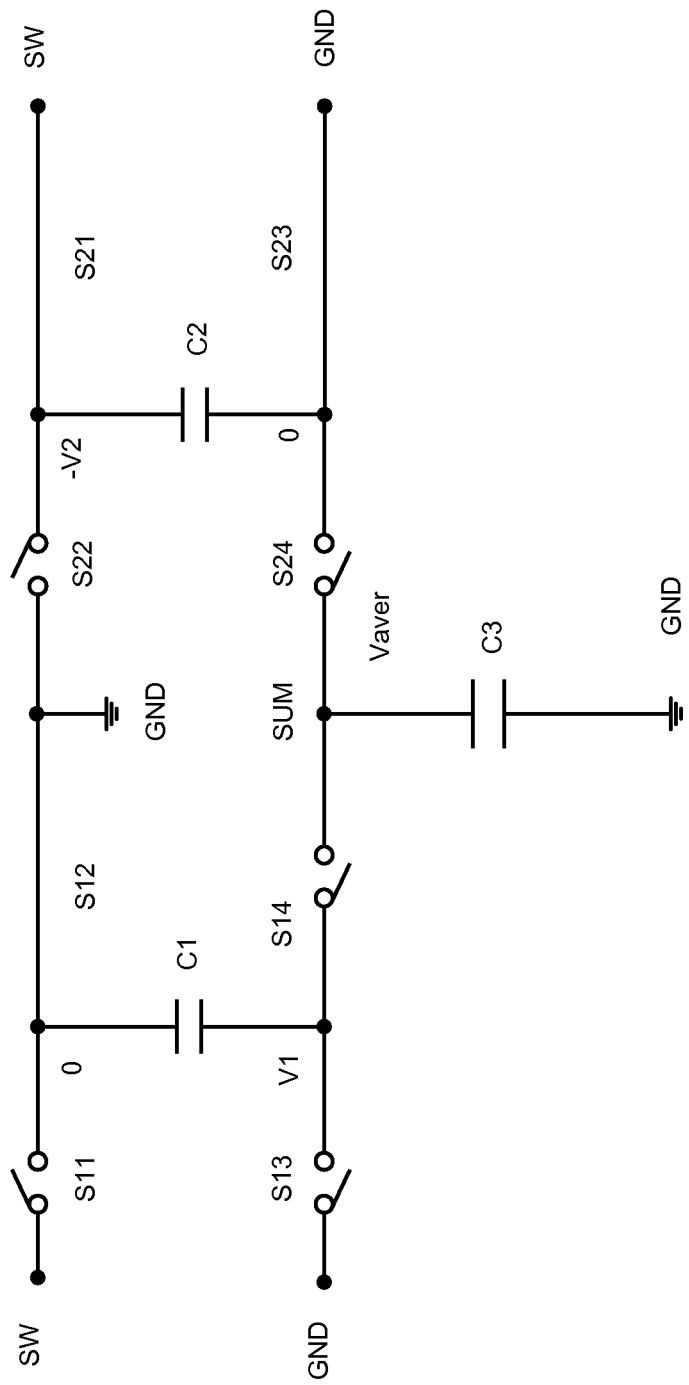

As shown in FIG. 9(b), in mode MOD2, the logic signal Q and the inverted pulse signal P' are both logic high, while the inverted logic signal Q' and the pulse signal P are both logic low, thus turning on the switches S12, S21 and S23 as well as turning off the switches S11, S13, S14, S22 and S24. On one hand, upon the intrinsic characteristic of the capacitor C1 and the first terminal thereof being grounded, the potential at the second terminal of the capacitor C1 converts into V1 volts and is then held until MOD3. On the other hand, the capacitor C2 samples the voltage across the low-side switch M2 in mode MOD2. As a result, the potentials at the first and second terminals of the capacitor C2 are respectively −V2 and zero volts.

Figure 9C:
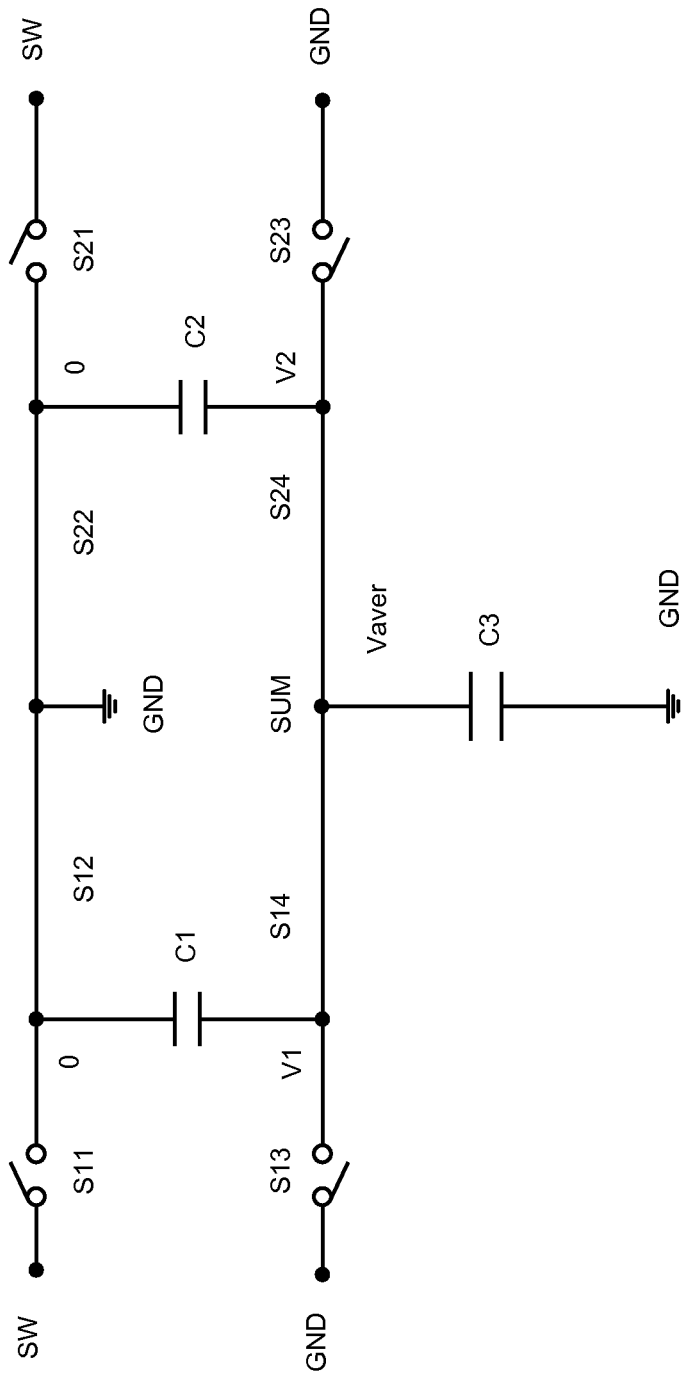

As shown in FIG. 9(c), in mode MOD3, the logic signal Q and pulse signal P are both logic low, while the inverted logic signal Q' and the inverted pulse signal P' are both logic high, thus turning on the switches S12, S14, S22 and S24 as well as turning off the switches S11, S13, S21 and S23. As a result, the potential at the second terminal of the capacitor C2 converts into V2 volts. In addition, the average value of the absolute values V1 and V2 is obtained at the output terminal SUM.

It is known from the above description of the operation, the average voltage detecting circuit 713 is capable of detecting the voltages across the low-side switch M2 at moments t1 and t2 and further calculating the voltage at the middle moment tm based on the detected voltages. As a result, after several switching cycles, the voltage across the capacitor C3 is substantially equal to the average voltage Vaver.

Figure 10:
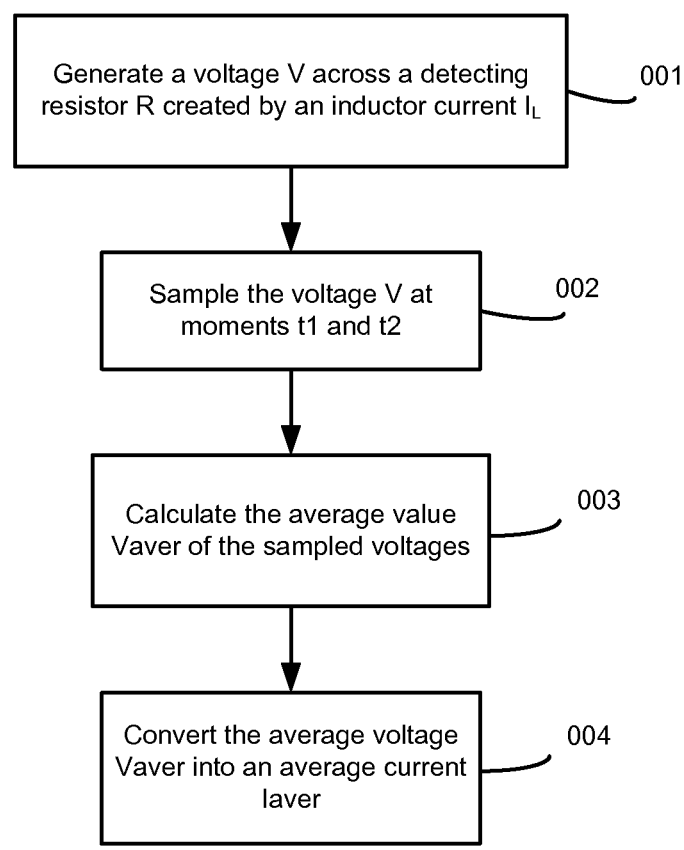
FIG. 10 illustrates a method for detecting the average current of a power converter in accordance with an embodiment of the present invention.

FIG. 10 illustrates a method for detecting the average current of a power converter in accordance with an embodiment of the present invention. The power converter comprises a switch and an output inductor. As shown in FIG. 10, the average current detecting method comprises steps 001~004. When the average current detecting method gets started, step 001 is performed to generate a voltage V across a detecting resistor R by letting an inductor current $I_L$ flowing through the output inductor flow through the detecting resistor R. In the next step 002, the values of the voltage across the detecting resistor R at moments t1 and t2 are sampled so that the average value of the sampled voltage values is calculated in the subsequent step 003, wherein moment t1 represents the moment when the switch is turned on, while moment t2 represents the moment when the switch is turned off. The average value herein is also referred to as an average voltage Vaver which is further converted into an average current layer by multiplying by a scaling factor in the next step 004.

It should be noted that, in one embodiment, the above-mentioned scaling factor is proportional to 1/R (R refers to the resistance of the detecting resistor herein). Further, in another embodiment, the detecting resistor R may be the on-resistance of the switch, a resistor series-connected to the switch or any resistor comprised in the conducting loop in which the inductor current $I_L$ flows. Still yet, the switch may refer to a high-side switch or a low-side switch in the context of the functionality and architecture of FIG. 2 and FIG. 7. In such embodiment, moments t1 and t2 respectively represent the moments when the high-side switch is turned on and off, or the moments when the low-side switch is turned on and off.

It will be appreciated by persons skilled in the art that the present invention is not limited to what has been particularly shown and described herein above. Rather the scope of the present invention is defined by the appended claims and includes both combinations and sub-combinations of the various features described hereinabove as well as variations and modifications thereof which would occur to persons skilled in the art upon reading the foregoing description and which are not in the prior art.

I claim:

1. An average current detecting circuit for a power converter, wherein the power converter comprises a control circuit and a switching circuit comprising a switch and an output inductor, and wherein the switch has a switch cycle which is defined as being from an on moment when the switch is turned on until the next following on moment when the switch is turned on again, the average current detecting circuit comprising:

an average voltage detecting circuit configured to receive an inductor current flowing through the output inductor, and wherein the average voltage detecting circuit is configured to sample the voltage V1 across a detecting resistor having a first terminal and a second terminal created by the inductor current at the on moment of the switch cycle and the voltage V2 across the detecting resistor at the moment of the same switch cycle when the switch is turned off and to calculate an average value Vaver, wherein Vaver=(V1+V2)/2; and a voltage-current converting circuit electrically coupled to the average voltage detecting circuit to receive the average value Vaver, wherein the voltage-current converting circuit is configured to generate an average current proportional to the average value Vaver with a scaling factor.

2. The average current detecting circuit of claim 1, wherein the scaling factor is proportional to 1/R, wherein R represents the resistance of the detecting resistor.

3. The average current detecting circuit of claim 1, wherein the switching circuit comprises a high-side switch having a first terminal and a second terminal and a low-side switch having a first terminal and a second terminal, and wherein the first terminal of the high-side switch is configured to receive an input voltage, the first terminal of the low-side switch is electrically coupled to the second terminal of the high-side switch, and the second terminal of the low-side switch is electrically coupled to a reference ground, and further wherein the sampling moments respectively represent the moment when the high-side switch is turned on and the moment when the high-side switch is turned off or the moment when the low-side switch is turned on and the moment when the low-side switch is turned off.

4. The average current detecting circuit of claim 1, wherein the on-resistance of the switch is used as the detecting resistor.

5. The average current detecting circuit of claim 1, wherein the average voltage detecting circuit comprises:
a first switch having a first terminal and a second terminal, wherein the first terminal is electrically coupled to the second terminal of the detecting resistor;
a second switch having a first terminal and a second terminal, wherein the first terminal is electrically coupled to the second terminal of the first switch, and the second terminal is electrically coupled to a reference ground;
a third switch having a first terminal and a second terminal, wherein the first terminal is electrically coupled to the first terminal of the detecting resistor;
a fourth switch having a first terminal and a second terminal, wherein the first terminal is electrically coupled to the second terminal of the third switch;
a first capacitor electrically coupled between the second terminal of the first switch and the second terminal of the third switch;
a fifth switch having a first terminal and a second terminal, wherein the first terminal is electrically coupled to the second terminal of the detecting resistor;
a sixth switch having a first terminal and a second terminal, wherein the first terminal is electrically coupled to the second terminal of the fifth switch, and the second terminal is electrically coupled to the reference ground;
a seventh switch having a first terminal and a second terminal, wherein the first terminal is electrically coupled to the first terminal of the detecting resistor;
an eighth switch having a first terminal and a second terminal, wherein the first terminal is electrically coupled to the second terminal of the seventh switch, and the second terminal is electrically coupled to the second terminal of the fourth switch;
a second capacitor electrically coupled between the second terminal of the fifth switch and the second terminal of the seventh switch; and
a third capacitor having a first terminal and a second terminal, wherein the first terminal is electrically coupled to the second terminal of the fourth switch and configured to provide the average value Vaver, and the second terminal is electrically coupled to the reference ground.

6. The average current detecting circuit of claim 5, wherein the control circuit comprises:
a logic circuit configured to generate a logic signal to control the switching actions of the fifth switch and the seventh switch;
a delay circuit electrically coupled to the logic circuit to receive the logic signal and configured to generate a delay signal by delaying the falling edge of the logic signal to control the switching actions of the switch;
a pulse generating circuit electrically coupled to the logic circuit to receive the logic signal and configured to generate a pulse signal at the rising edge of the logic signal to control the switching actions of the first switch and the third switch;
a first inverter electrically coupled to the pulse generating circuit to receive the pulse signal and configured to generate an inverted pulse signal of the pulse signal to control the switching actions of the second switch; and
a second inverter electrically coupled to the logic circuit to receive the logic signal and configured to generate an inverted logic signal of the logic signal to control the switching actions of the fourth switch, the sixth switch and the eighth switch.

7. The average current detecting circuit of claim 1, wherein the voltage-current converting circuit comprises:
an error amplifier having a first input terminal, a second input terminal and an output terminal, wherein the first input terminal is electrically coupled to the average voltage detecting circuit to receive the average value Vaver;
a first transistor having a first terminal, a second terminal and a control terminal, wherein the control terminal is electrically coupled to the output terminal of the error amplifier, and the second terminal is electrically coupled to the second input terminal of the error amplifier;
a second transistor having a first terminal, a second terminal and a control terminal, wherein the first terminal is electrically coupled to the control terminal of the second transistor and the second terminal of the first transistor, and the second terminal is electrically coupled to a reference ground; and
a current mirror having a first terminal and a second terminal, wherein the first terminal is electrically coupled to the first terminal of the first transistor and the second terminal is configured to provide the average current.

8. The average current detecting circuit of claim 7, wherein the voltage-current converting circuit further comprises:
a ninth switch having a first terminal and a second terminal, wherein the first terminal is electrically coupled to the second terminal of the current mirror, and the second terminal is configured to provide the average current, and wherein the ninth switch is turned off when the inductor current is zero; and
a fourth capacitor electrically coupled between the second terminal of the ninth switch and the reference ground.

9. The average current detecting circuit of claim 7, wherein the on-resistance of the second transistor is proportional to R, wherein R represents the resistance of the detecting resistor.

10. A power converter, comprising:
a switching circuit comprising a switch and an output inductor, wherein the switching circuit is configured to receive an input voltage and to further convert the input voltage into an output voltage, and wherein the switch has a switch cycle which is defined as being from an on moment when the switch is turned on until the next following on moment when the switch is turned on again;

a control circuit configured to generate a control signal to control the switching actions of the switch; and an average current detecting circuit comprises:

an average voltage detecting circuit configured to receive an inductor current flowing through the output inductor, and wherein the average voltage detecting circuit is configured to sample the voltage V1 across a detecting resistor having a first terminal and a second terminal created by the inductor current at the on moment of the switch cycle and the voltage V2 across the detecting resistor at the moment of the same switch cycle when the switch is turned off and to calculate an average value Vaver, wherein Vaver= (V1+V2)/2; and a voltage-current converting circuit electrically coupled to the average voltage detecting circuit to receive the average value Vaver, wherein the voltage-current converting circuit is configured to generate an average current proportional to the average value Vaver with a scaling factor.

11. The power converter of claim 10, wherein the scaling factor is proportional to 1/R, wherein R represents the resistance of the detecting resistor.

12. The power converter of claim 10, wherein the switching circuit comprises a high-side switch having a first terminal and a second terminal and a low-side switch having a first terminal and a second terminal, and wherein the first terminal of the high-side switch is configured to receive an input voltage, the first terminal of the low-side switch is electrically coupled to the second terminal of the high-side switch, and the second terminal of the low-side switch is electrically coupled to a reference ground, and further wherein the sampling moments respectively represent the moment when the high-side switch is turned on and the moment when the high-side switch is turned off or the moment when the low-side switch is turned on and the moment when the low-side switch is turned off.

13. The power converter of claim 10, wherein the average voltage detecting circuit comprises:

a first switch having a first terminal and a second terminal, wherein the first terminal is electrically coupled to the second terminal of the detecting resistor;

a second switch having a first terminal and a second terminal, wherein the first terminal is electrically coupled to the second terminal of the first switch, and the second terminal is electrically coupled to a reference ground;

a third switch having a first terminal and a second terminal, wherein the first terminal is electrically coupled to the first terminal of the detecting resistor;

a fourth switch having a first terminal and a second terminal, wherein the first terminal is electrically coupled to the second terminal of the third switch;

a first capacitor electrically coupled between the second terminal of the first switch and the second terminal of the third switch;

a fifth switch having a first terminal and a second terminal, wherein the first terminal is electrically coupled to the second terminal of the detecting resistor;

a sixth switch having a first terminal and a second terminal, wherein the first terminal is electrically coupled to the second terminal of the fifth switch, and the second terminal is electrically coupled to the reference ground;

a seventh switch having a first terminal and a second terminal, wherein the first terminal is electrically coupled to the first terminal of the detecting resistor;

an eighth switch having a first terminal and a second terminal, wherein the first terminal is electrically coupled to the second terminal of the seventh switch, and the second terminal is electrically coupled to the second terminal of the fourth switch;

a second capacitor electrically coupled between the second terminal of the fifth switch and the second terminal of the seventh switch; and a third capacitor having a first terminal and a second terminal, wherein the first terminal is electrically coupled to the second terminal of the fourth switch and serves as an output terminal of the average voltage detecting circuit to provide the average value Vaver, and the second terminal is electrically coupled to the reference ground.

14. The power converter of claim 13, wherein the control circuit comprises:

a logic circuit configured to generate a logic signal to control the switching actions of the fifth switch and the seventh switch;

a delay circuit electrically coupled to the logic circuit to receive the logic signal and configured to generate a delay signal by delaying the falling edge of the logic signal to control the switching actions of the switch;

a pulse generating circuit electrically coupled to the logic circuit to receive the logic signal and configured to generate a pulse signal at the rising edge of the logic signal to control the switching actions of the first switch and the third switch;

a first inverter electrically coupled to the pulse generating circuit to receive the pulse signal and configured to generate an inverted pulse signal of the pulse signal to control the switching actions of the second switch; and a second inverter electrically coupled to the logic circuit to receive the logic signal and configured to generate an inverted logic signal of the logic signal to control the switching actions of the fourth switch, the sixth switch and the eighth switch.

15. The power converter of claim 10, wherein the voltage-current converting circuit comprises:

an error amplifier having a first input terminal, a second input terminal and an output terminal, wherein the first input terminal is electrically coupled to the average voltage detecting circuit to receive the average value Vaver;

a first transistor having a first terminal, a second terminal and a control terminal, wherein the control terminal is electrically coupled to the output terminal of the error amplifier, and the second terminal is electrically coupled to the second input terminal of the error amplifier;

a second transistor having a first terminal, a second terminal and a control terminal, wherein the first terminal is electrically coupled to the control terminal of the second transistor and the second terminal of the first transistor, and the second terminal is electrically coupled to a reference ground; and a current mirror having a first terminal and a second terminal, wherein the first terminal is electrically coupled to the first terminal of the first transistor and the second terminal is configured to provide the average current.

16. The power converter of claim 15, wherein the voltage-current converting circuit further comprises:
a ninth switch having a first terminal and a second terminal, wherein the first terminal is electrically coupled to the second terminal of the current mirror, and the second terminal is configured to provide the average current, and wherein the ninth switch is turned off when the inductor current is zero; and
a fourth capacitor electrically coupled between the second terminal of the ninth switch and the reference ground.

17. The power converter of claim 15, wherein the on-resistance of the second transistor is proportional to R, wherein R represents the resistance of the detecting resistor.

18. A method for detecting an average current of a power converter, wherein the power converter comprises a switch and an output inductor, and wherein the switch has a switch cycle which is defined as being from an on moment when the switch is turned on until the next following on moment when the switch is turned on again, the detecting method comprises:
generating a voltage across a detecting resistor created by an inductor current flowing through the output inductor;
sampling the voltage with a value V1 at the on moment of the switch cycle and the voltage with a value V2 at the moment of the same switch cycle when the switch is turned off;
calculating an average value Vaver, wherein Vaver=(V1+V2)/2; and
generating an average current proportional to the average value Vaver with a scaling factor.

19. The detecting method of claim 18, wherein the scaling factor is proportional to 1/R, wherein R represents the resistance of the detecting resistor.

20. The detecting method of claim 18, wherein the switch comprises a high-side switch and a low-side switch, and wherein the sampling moments respectively represent the moment when the high-side switch is turned on and the moment when the high-side switch is turned off or the moment when the low-side switch is turned on and the moment when the low-side switch is turned off.

* * * * *